(12) United States Patent
Ishikawa et al.

(10) Patent No.: US 10,751,976 B2
(45) Date of Patent: Aug. 25, 2020

(54) RESIN-CLAD METAL FOIL AND FLEXIBLE PRINTED WIRING BOARD

(71) Applicants: PANASONIC INTELLECTUAL PROPERTY MANAGEMENT CO., LTD., Osaka (JP); TOMOEGAWA CO., LTD., Tokyo (JP)

(72) Inventors: Yohsuke Ishikawa, Fukushima (JP); Yoshiaki Esaki, Osaka (JP); Takayoshi Ozeki, Osaka (JP); Jun Tochihira, Shizuoka (JP); Ryu Harada, Shizuoka (JP)

(73) Assignees: PANASONIC INTELLECTUAL PROPERTY MANAGEMENT CO., LTD., Osaka (JP); TOMOEGAWA CO., LTD., Tokyo (JP)

( * ) Notice: Subject to any disclaimer, the term of this patent is extended or adjusted under 35 U.S.C. 154(b) by 96 days.

(21) Appl. No.: 16/072,715

(22) PCT Filed: Jan. 24, 2017

(86) PCT No.: PCT/JP2017/002297
§ 371 (c)(1),
(2) Date: Jul. 25, 2018

(87) PCT Pub. No.: WO2017/130947
PCT Pub. Date: Aug. 3, 2017

(65) Prior Publication Data
US 2019/0061320 A1    Feb. 28, 2019

(30) Foreign Application Priority Data

Jan. 26, 2016 (JP) ................................. 2016-012063

(51) Int. Cl.
*B32B 3/00* (2006.01)
*B32B 15/088* (2006.01)
(Continued)

(52) U.S. Cl.
CPC ............ *B32B 15/088* (2013.01); *B32B 15/08* (2013.01); *B32B 15/20* (2013.01); *B32B 27/08* (2013.01);
(Continued)

(58) Field of Classification Search
CPC ...... H05K 1/0393; B32B 15/08; B32B 15/20; B32B 15/0888; B32B 15/085; B32B 27/32; B32B 27/34; B32B 27/281
See application file for complete search history.

(56) References Cited

U.S. PATENT DOCUMENTS 5,460,680 A   10/1995  Yamaguchi et al.
5,626,713 A   5/1997   Yamaguchi et al.
(Continued)

FOREIGN PATENT DOCUMENTS

JP   63-058997   3/1988
JP   05-021911   1/1993
(Continued)

OTHER PUBLICATIONS

International Search Report issued in International Pat. Appl. No. PCT/JP2017/002297, dated Apr. 4, 2017.
(Continued)

*Primary Examiner* — Elizabeth E Mulvaney
(74) *Attorney, Agent, or Firm* — Greenblum & Bernstein, P.L.C.

(57) ABSTRACT

A resin-clad metal foil which enables a reduction in fluidity of a resin during molding and a reduction in extrusion of the resin while maintaining good adhesiveness, bendability, thermal resistance, and circuit filling property. A first insulating layer includes a polyimide resin layer, a polyamideimide resin layer, a liquid crystal polymer resin layer, a fluororesin layer, or a polyphenylene ether resin layer and a second insulating layer includes a polyolefin resin layer in a
(Continued)

semi-cured state are disposed in this order on a metal foil. The polyolefin resin layer contains a component representing a polyolefin-based elastomer and a component representing a thermosetting resin. The percentage by mass of the component in the polyolefin resin layer ranges from 50 wt. % to 95 wt. %.

6 Claims, 2 Drawing Sheets

(51) Int. Cl.
  *B32B 15/08*  (2006.01)
  *H05K 3/46*  (2006.01)
  *B32B 15/20*  (2006.01)
  *B32B 27/08*  (2006.01)
  *B32B 27/28*  (2006.01)
  *B32B 27/32*  (2006.01)
  *B32B 27/34*  (2006.01)
  *B32B 27/42*  (2006.01)
  *H05K 1/03*  (2006.01)

(52) U.S. Cl.
  CPC ............ *B32B 27/281* (2013.01); *B32B 27/32* (2013.01); *B32B 27/322* (2013.01); *B32B 27/34* (2013.01); *B32B 27/42* (2013.01); *H05K 1/036* (2013.01); *H05K 1/0393* (2013.01); *H05K 3/4655* (2013.01); *B32B 2307/202* (2013.01); *B32B 2307/206* (2013.01); *B32B 2457/08* (2013.01); *H05K 1/0373* (2013.01); *H05K 2201/015* (2013.01); *H05K 2201/0141* (2013.01); *H05K 2201/0154* (2013.01); *H05K 2201/0158* (2013.01); *H05K 2201/0195* (2013.01); *H05K 2201/0209* (2013.01)

(56) References Cited

U.S. PATENT DOCUMENTS 9,125,307 B2 * 9/2015 Ozeki .................. H05K 3/4655
2012/0144666 A1 * 6/2012 Yukiiri ................ H05K 3/0035
                    29/846

FOREIGN PATENT DOCUMENTS

| JP | 05-191046 | 7/1993 |
|---|---|---|
| JP | 2004-315595 | 11/2004 |
| JP | 2014-129520 | 7/2014 |
| WO | 2009/145224 | 12/2009 |

OTHER PUBLICATIONS

International Preliminary Report of Patentability issued in International Pat. Appl. No. PCT/JP2017/002297, dated Jul. 31, 2018.

\* cited by examiner

RESIN-CLAD METAL FOIL AND FLEXIBLE PRINTED WIRING BOARD

TECHNICAL FIELD

The present invention relates to resin-clad metal foils and flexible printed wiring boards, and specifically to a resin-clad metal foil adopted in the fabrication of a printed wiring board such as a flexible printed wiring board and a flexible printed wiring board included in various electronic apparatuses.

BACKGROUND ART

Compact and thin electronic apparatuses include a large number of flexible printed wiring boards. To achieve higher-density and thinner electronic apparatuses, the flexible printed wiring boards having a multilayer structure have been more required. In addition, the flexible printed wiring boards are required to be of a higher quality. As materials for realizing multilayer structures of flexible printed wiring boards, bonding sheets or coverlays are adopted as insulating layers, and metal foils such as copper foils are adopted as conductive layers. To satisfy the demand for a reduction in thickness, a resin-clad metal foil has been proposed (e.g., see Patent Literature 1).

Moreover, in a known method for fabricating a multilayer printed board (e.g., see Patent Literature 2), a perforated substrate having holes, a film-shaped adhesive having holes corresponding to the holes in the substrate, and a printed board having a copper pattern are hot pressed with the film-shaped adhesive being sandwiched between the perforated substrate and the printed board to mold a stack. In this method, in order to prevent the film-shaped adhesive from being extruded into the holes in the perforated substrate, the hot pressing is performed with a thermoplastic resin sheet being disposed on the perforated substrate to mold the stack.

In order to reduce the thickness of the multilayer printed board, a perforated resin-clad metal foil may be used instead of the perforated substrate and the adhesive film. Specifically, the printed board, the perforated resin-clad metal foil, and a thermoplastic resin sheet are hot pressed with a resin part of the perforated resin-clad metal foil being disposed on the printed board and the thermoplastic resin sheet being disposed on a metal foil part of the perforated resin-clad metal foil to mold a stack. During the molding, the thermoplastic resin sheet is thermally deformed to fill the holes in the perforated resin-clad metal foil, which enables extrusion of a resin of the perforated resin-clad metal foil into the holes to be reduced.

The printed board has, however, a surface which is provided with the copper pattern and is thus uneven. Thus, when the hot pressing is performed with the thermoplastic resin sheet being provided, the unevenness of the surface of the printed board may result in an uneven surface of the metal foil of the perforated resin-clad metal foil. When the surface of the metal foil is uneven and is no longer smooth, mounting components on the surface with a high density becomes difficult.

Thus, adopting a resin having a high degree of fluidity as a resin of the perforated resin-clad metal foil without providing the thermoplastic resin sheet is considered. In this case, the resin is more likely to flow during the molding and the unevenness of the surface of the printed board is smoothed to secure the smoothness of the surface of the metal foil on the printed board. Moreover, the adhesive property, bending property, thermal resistance, and circuit filling property of the printed board are good. However, since the resin of the perforated resin-clad metal foil has a high degree of fluidity, the resin is extruded into the holes.

CITATION LIST

Patent Literature

Patent Literature 1: WO 2009/145224 A1
Patent Literature 2: JP H05-191046 A

SUMMARY OF INVENTION

An object of the present invention is to provide a resin-clad metal foil and a flexible printed wiring board which enable the degree of fluidity of a resin during molding to be reduced and enable extrusion of the resin to be reduced while maintaining good adhesiveness, bendability, thermal resistance, and circuit filling property.

A resin-clad metal foil of one aspect according to the present invention is a resin-clad metal foil including a metal foil, a first insulating layer, and a second insulating layer. The first insulating layer and the second insulating layer are disposed in this order on the metal foil. The first insulating layer includes a polyimide resin layer, a polyamideimide resin layer, a liquid crystal polymer resin layer, a fluororesin layer, or a polyphenylene ether resin layer. The second insulating layer includes a polyolefin resin layer in a semi-cured state. The polyolefin resin layer contains a component (A) representing a polyolefin-based elastomer and a component (B) representing a thermosetting resin. A percentage by weight of the component (A) representing the polyolefin-based elastomer in the polyolefin resin layer ranges from 50 wt. % to 95 wt. %.

DESCRIPTION OF EMBODIMENTS

An embodiment of the present invention will be described below.

<Resin-Clad Metal Foil>

A resin-clad metal foil 30 of the present embodiment will be described. The resin-clad metal foil 30 may be adopted as a material for a flexible printed wiring board 40 which will be described later. FIGS. 1A to 1F show specific examples of the resin-clad metal foil 30. The resin-clad metal foil 30 includes a metal foil 50, a first insulating layer 21, and a second insulating layer 22. The first insulating layer 21 and the second insulating layer 22 are disposed in this order on the metal foil 50.

The first insulating layer 21 includes a polyimide resin layer 9, a polyamideimide resin layer 8, a liquid crystal polymer resin layer 4, a fluororesin layer 5, or a polyphenylene ether resin layer 6. The first insulating layer 21 may include at least any one of a thermosetting resin and a thermoplastic resin.

Figure 1A:
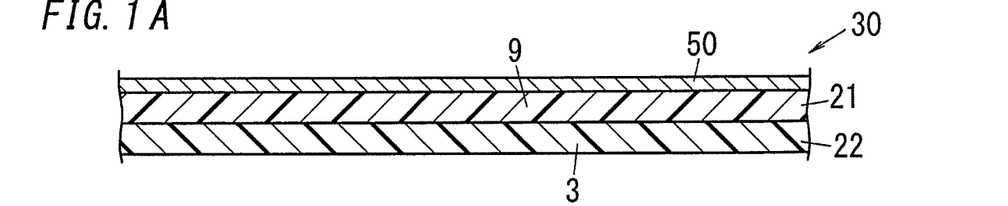
FIGS. 1A to 1F are schematic sectional views illustrating examples of a resin-clad metal foil according to an embodiment of the present invention.

In a resin-clad metal foil 30 shown in FIG. 1A, a first insulating layer 21 includes the polyimide resin layer 9. The polyimide resin layer 9 is made of a polyimide resin composition containing a polyimide resin as a main component. The polyimide resin composition may contain, for example, a polyetherimide resin and/or a polyether sulfone resin.

Figure 1B:
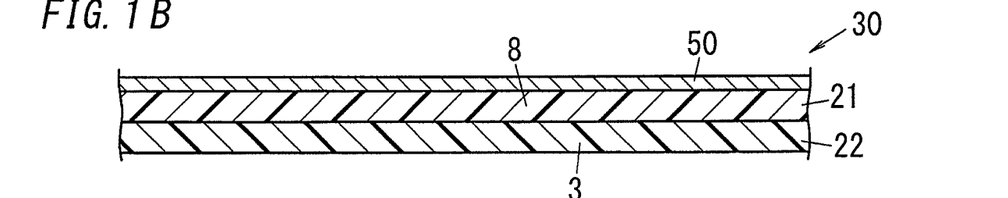

In a resin-clad metal foil 30 shown in FIG. 1B, a first insulating layer 21 includes the polyamideimide resin layer 8. The polyamideimide resin layer 8 is made of a polyamideimide resin composition containing a polyamideimide resin as a main component. The polyamideimide resin composition may contain, for example, a polyetherimide resin and/or a polyether sulfone resin.

Figure 1C:
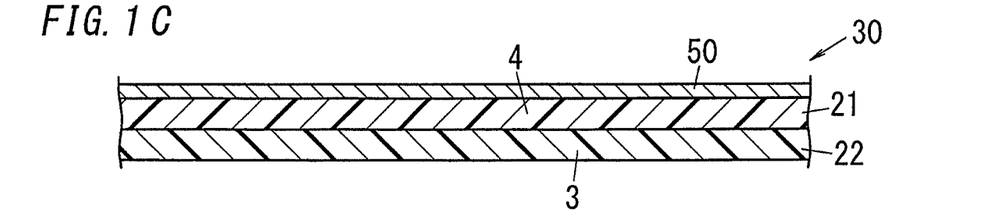

In a resin-clad metal foil 30 shown in FIG. 1C, a first insulating layer 21 includes the liquid crystal polymer resin layer 4. The liquid crystal polymer resin layer 4 is made of a liquid crystal polymer resin composition containing a liquid crystal polymer resin as a main component. The liquid crystal polymer resin has a structure in which para-hydroxybenzoic acid is linearly ester-bonded to various components (e.g., 6-hydroxy-2-naphthoic acid).

Figure 1D:
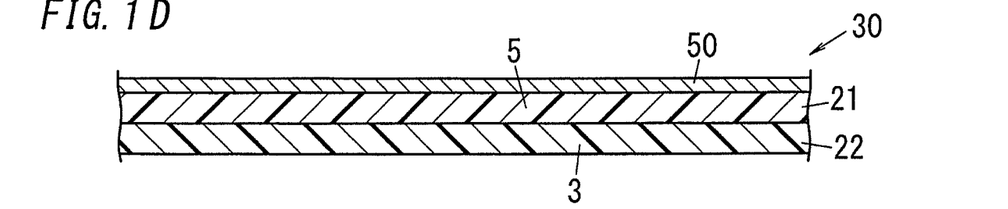

A resin-clad metal foil 30 shown in FIG. 1D, a first insulating layer 21 includes the fluororesin layer 5. The fluororesin layer 5 is made of a fluorine resin composition containing a fluorine resin as a main component. The fluorine resin is a synthetic resin obtained by polymerization of olefin containing fluorine. Specific examples of the fluorine resin include polytetrafluoroethylene.

Figure 1E:
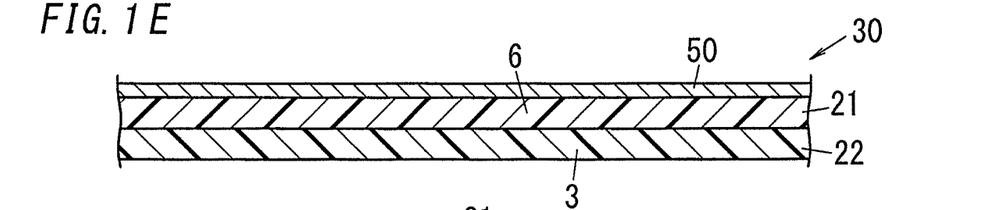

In a resin-clad metal foil 30 shown in FIG. 1E, a first insulating layer 21 includes the polyphenylene ether resin layer 6. The polyphenylene ether resin layer 6 is made of a polyphenylene ether resin composition containing a polyphenylene ether resin as a main component. The polyphenylene ether resin is a polymer of 2,6-dimethyl phenylene oxide. Examples of the polyphenylene ether resin include a modified polyphenylene ether resin. The modified polyphenylene ether resin is a polymer alloy of a polyphenylene ether resin and another resin such as a polystyrene resin. The modified polyphenylene ether resin has excellent molding fluidity.

Figure 1F:
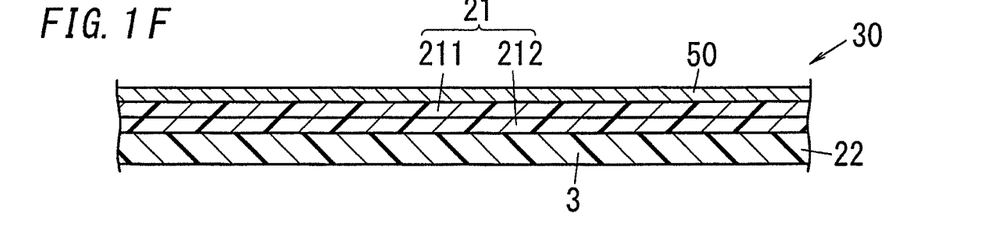

In a resin-clad metal foil 30 shown in FIG. 1F, a first insulating layer 21 includes a coated layer 211 and a film layer 212. Each of the coated layer 211 and the film layer 212 includes the polyimide resin layer 9, the polyamideimide resin layer 8, the liquid crystal polymer resin layer 4, the fluororesin layer 5, or the polyphenylene ether resin layer 6. That is, the first insulating layer 21 of the resin-clad metal foil 30 shown in FIG. 1F includes two layers selected from a group consisting of the polyimide resin layer 9, the polyamideimide resin layer 8, the liquid crystal polymer resin layer 4, the fluororesin layer 5, and the polyphenylene ether resin layer 6. Two layers, which are the coated layer 211 and the film layer 212, constituting the first insulating layer 21 may be the same resin layers or different resin layers.

As described above, in each of FIGS. 1A to 1F, particularly because the first insulating layer 21 includes the polyimide resin layer 9, the polyamideimide resin layer 8, the liquid crystal polymer resin layer 4, the fluororesin layer 5, or the polyphenylene ether resin layer 6, the thermal resistance and the dimensional stability of the resin-clad metal foil 30 can be increased. The thermal resistance and the dimensional stability of the flexible printed wiring board 40 fabricated from the resin-clad metal foil 30 as a material can also be increased. Note that the first insulating layer 21 may contain at least one of the thermosetting resin and the thermoplastic resin and may thus be in a fully cured state, a semi-cured state, or a hardened state.

The second insulating layer 22 includes the polyolefin resin layer 3 in the semi-cured state. The semi-cured state denotes a state at an intermediate stage during a curing reaction. The intermediate state is a stage between A-stage corresponding to a varnish state and C-stage corresponding to a cured state. The polyolefin resin layer 3 in the semi-cured state corresponds to a polyolefin resin layer cured to such an extent that the polyolefin resin layer exhibits no stickiness at room temperature. When being further heated, the polyolefin resin layer 3 once melts and then completely cures so as to be a polyolefin resin layer 3 in C-stage. The polyolefin resin layer 3 is made of a polyolefin resin composition containing a polyolefin resin as a main component.

The polyolefin resin layer 3 contains a component (A) representing a polyolefin-based elastomer and a component (B) representing a thermosetting resin, and the percentage by weight of the component (A) representing the polyolefin-based elastomer in the polyolefin resin layer 3 ranges from 50 wt. % to 95 wt. %. When the polyolefin resin layer 3 contains, as in this case, a large amount of the component (A) representing the polyolefin-based elastomer, the fluidity of a resin (in particular, a polyolefin resin composition) during molding can be reduced to reduce extrusion of the resin. Moreover, the flexibility of each of the resin-clad metal foil 30 and the flexible printed wiring board 40 fabricated from the resin-clad metal foil 30 as a material increases, thereby further increasing bendability. When the percentage by weight of the component (A) representing the polyolefin-based elastomer in the polyolefin resin layer 3 is less than 50 wt. %, the bendability cannot be sufficiently increased. Moreover, the component (A) representing the polyolefin-based elastomer has a large thermal expansion coefficient, and therefore, when the percentage by weight of the component (A) representing the polyolefin-based elastomer in the polyolefin resin layer 3 is higher than 95 wt. %, a dimensional change during molding increases, and the flexible printed wiring board 40 after molding has a bigger warp.

The component (A) representing the polyolefin-based elastomer preferably contains one kind or two or more kinds of components selected from a group consisting of polystyrene-poly (ethylene/propylene) block-polystyrene copolymer, polystyrene-poly (ethylene-ethylene/propylene) block-polystyrene copolymer, polystyrene-poly (ethylene/butylene) block-polystyrene copolymer, polystyrene-polyisoprene block copolymer, hydrogenated polystyrene-polyisoprene-polybutadiene block copolymer, polystyrene-poly (butadiene/butylene) block-polystyrene copolymer, ethylene-glycidyl methacrylate copolymer, ethylene-glycidyl methacrylate-methyl acrylate copolymer, and ethylene-glycidyl methacrylate-vinyl acetate copolymer.

The component (B) representing the thermosetting resin preferably contains one kind or two or more kinds of components selected from a group consisting of an epoxy resin, a phenol resin, a bismaleimide resin, and a polyphenylene ether oligomer having vinyl groups at both ends. Examples of the epoxy resin include a dicyclopentadiene epoxy resin.

The polyolefin resin layer 3 may further contain a component (C) representing a curing accelerator. Examples of the curing accelerator include 2-ethyl-4-methylimidazole.

The polyolefin resin layer 3 may further contain a component (D) representing filler. Examples of the filler include silica.

The polyolefin resin layer 3 subjected to a treatment at 180° C. for 60 minutes preferably has a storage elastic modulus within a range of $10^5$ Pa to $10^8$ Pa at a temperature ranging from 25° C. to 150° C. This can increase the thermal shock resistance of the flexible printed wiring board 40 and further the solder thermal resistance during reflow.

Next, a method for fabricating the resin-clad metal foil 30 will be described.

The resin-clad metal foil 30 shown in each of FIGS. 1A to 1E may be fabricated by, for example, the following method.

First, a liquid polyimide resin composition, a liquid polyamideimide resin composition, a liquid crystal polymer resin composition, a liquid fluorine resin composition, or a liquid polyphenylene ether resin composition is applied to a surface of the metal foil 50 such as a copper foil. Then, the composition is heated and dried to form the first insulating layer 21 including the polyimide resin layer 9, the polyamideimide resin layer 8, the liquid crystal polymer resin layer 4, the fluororesin layer 5, or the polyphenylene ether resin layer 6.

Then, a liquid polyolefin resin composition is applied to a surface of the first insulating layer 21 and is then heated and dried to form the second insulating layer 22 including the polyolefin resin layer 3. The resin-clad metal foil 30 shown in each of FIGS. 1A to 1E can thus be fabricated. In the resin-clad metal foil 30, the first insulating layer 21 is in a fully cured state, a semi-cured state, or a hardened state, and the second insulating layer 22 is in the semi-cured state.

The resin-clad metal foil 30 shown in each of FIGS. 1A to 1E may be fabricated by the following method.

First, as a film-like material, a polyimide film, a polyamideimide film, a liquid crystal polymer film, a fluorine resin film, or a polyphenylene ether film is bonded to a surface of the metal foil 50 such as a copper foil by compression, thereby forming the first insulating layer 21 including the polyimide resin layer 9, the polyamideimide resin layer 8, the liquid crystal polymer resin layer 4, the fluororesin layer 5, or the polyphenylene ether resin layer 6.

Then, a liquid polyolefin resin composition is applied to a surface of the first insulating layer 21 and is then heated and dried to form the second insulating layer 22 including the polyolefin resin layer 3. Thus, the resin-clad metal foil 30 shown in 1A to 1E can be fabricated. In the resin-clad metal foil 30, the first insulating layer 21 is in a fully cured state, the semi-cured state, or the hardened state, and the second insulating layer 22 is in the semi-cured state.

The resin-clad metal foil 30 shown in FIG. 1F can be fabricated by, for example, the following method.

A liquid polyimide resin composition, a liquid polyamideimide resin composition, a liquid crystal polymer resin composition, a liquid fluorine resin composition, or a liquid polyphenylene ether resin composition is applied to a surface of the metal foil 50 such as a copper foil to form the coated layer 211.

Then, a polyimide film, a polyamideimide film, a liquid crystal polymer film, a fluorine resin film, or a polyphenylene ether film is disposed on a surface of the coated layer 211 to form the film layer 212.

Then, a liquid polyolefin resin composition is applied to a surface of the film layer 212 and is then heated and dried. The resin-clad metal foil 30 shown in FIG. 1F can thus be fabricated. In the resin-clad metal foil 30, the first insulating layer 21 including the coated layer 211 and the film layer 212 is the polyimide resin layer 9, the polyamideimide resin layer 8, the liquid crystal polymer resin layer 4, the fluororesin layer 5, or the polyphenylene ether resin layer 6, and the second insulating layer 22 is the polyolefin resin layer 3 in the semi-cured state. The first insulating layer 21 may be in the fully cured state, the semi-cured state, or the hardened state.

<Flexible Printed Wiring Board>

Figure 2:
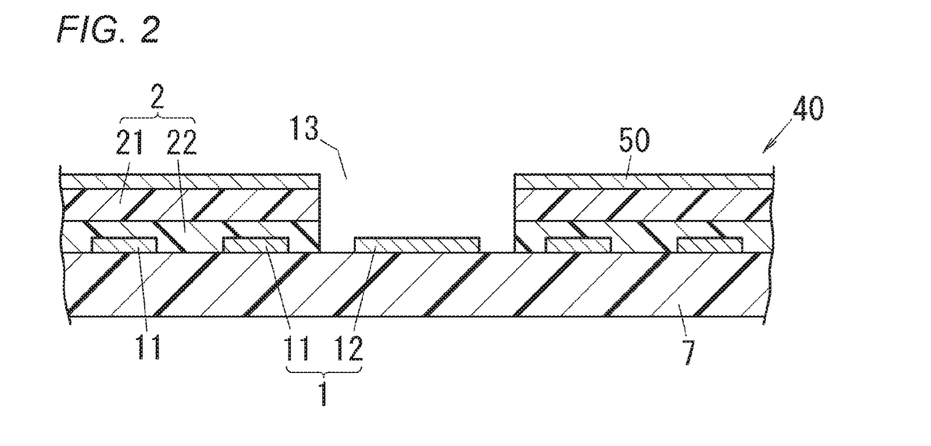
FIG. 2 is a schematic sectional view illustrating a flexible printed wiring board according to the embodiment of the present invention.

The flexible printed wiring board 40 of the present embodiment will be described. The flexible printed wiring board 40 includes an insulating layer 2 constituted by a fully cured material or a hardened material of the first insulating layer 21 and a fully cured material of the second insulating layer 22 of the resin-clad metal foil 30. FIG. 2 shows a specific example of the flexible printed wiring board 40. The flexible printed wiring board 40 shown in FIG. 2 includes an insulating film 7, a conductive layer 1, an insulating layer 2, the metal foil 50, and a blind hole 13. Note that examples of the flexible printed wiring board 40 also include a flex-rigid printed circuit board.

Examples of the insulating film 7 include a polyimide film, a polyamideimide film, a liquid crystal polymer film, a fluorine resin film, and a polyphenylene ether film.

The conductive layer 1 is disposed to form a prescribed pattern on a surface of the insulating film 7. The conductive layer 1 includes internal circuits 11 located in the insulating layer 2 and an external circuit 12 located outside the insulating layer 2.

The insulating layer 2 is disposed on the surface of the insulating film 7. The insulating layer 2 includes the fully cured material or the hardened material of the first insulating layer 21 and the fully cured material of the second insulating layer 22 of the resin-clad metal foil 30.

The metal foil 50 is disposed on a surface of the insulating layer 2. The metal foil 50 corresponds to the metal foil 50 of the resin-clad metal foil 30. Unnecessary portions of the metal foil 50 may be removed by, for example, etching to form a circuit on the surface of the insulating layer 2.

The blind hole 13 is a hole which penetrates through the insulating layer 2 and the metal foil 50 and which does not penetrate through the insulating film 7. The blind hole 13 has a bottom surface where the surface of the insulating film 7 is exposed, and on the surface of the insulating film 7, the external circuit 12 is provided.

The flexible printed wiring board 40 shown in FIG. 2 may be fabricated by, for example, the following method.

Figure 3:
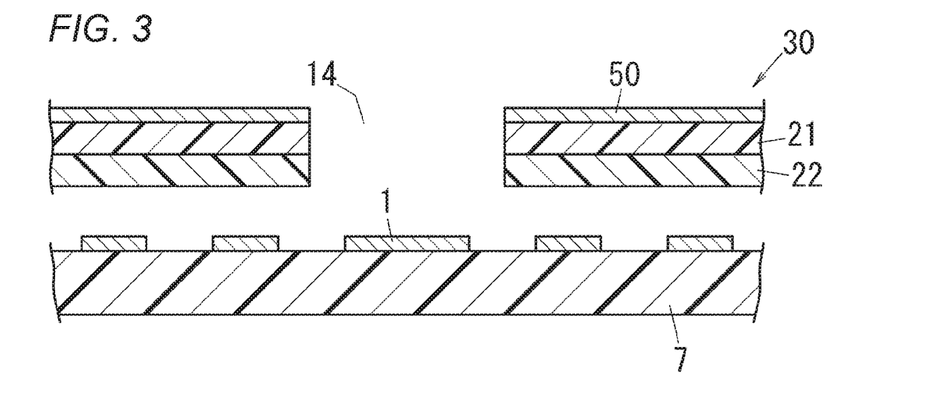
FIG. 3 is a schematic sectional view illustrating a fabricating process of the flexible printed wiring board according to the embodiment of the present invention.

First, as illustrated in FIG. 3, an insulating film 7 having a surface provided with a conductive layer 1 and a resin-clad metal foil 30 having a through hole 14 are prepared.

Next, the resin-clad metal foil 30 and the insulating film 7 are hot pressed with the second insulating layer 22 of the resin-clad metal foil 30 being on the surface of the insulating film 7, thereby molding a stack. The flexible printed wiring board 40 shown in FIG. 2 is thus fabricated.

In this embodiment, the second insulating layer 22 is formed from the polyolefin resin layer 3. Therefore, during the molding, the polyolefin resin composition is less likely to flow from the second insulating layer 22, and it is possible to restrict, for example, coverage of the external circuit 12 with the polyolefin resin composition extruded into the blind hole 13. Besides, it is not that the polyolefin resin composition does not flow at all during the molding. The polyolefin resin composition has fluidity to such an extent that the polyolefin resin composition flows without being extruded into the blind hole 13, and thus, the circuit filling property is good. That is, during the molding, the polyolefin resin composition fills a gap between the internal circuits 11 and 11, which enables the unevenness of the surface of the insulating film 7 to be smoothed. Moreover, during the molding, the surface of the metal foil 50 of the resin-clad metal foil 30 is not pressed by a cushioning material such as the thermoplastic resin sheet described in Patent Literature 2 but is pressed by a panel board. Therefore, the smoothness of the surface of the metal foil 50 can be secured after the molding. Moreover, in the thus obtained flexible printed wiring board 40, the metal foil 50 is firmly bonded to the insulating film 7 via the insulating layer 2. Thus, the metal foil 50 has a good adhesive property with respect to the insulating film 7. Thus, when the resin-clad metal foil 30 of the present embodiment is adopted as a material for fabricating the flexible printed wiring board 40, the fluidity of a resin (in particular, polyolefin resin composition) and the extrusion of the resin can be reduced during the molding while adhesiveness, bendability, thermal resistance, and circuit filling property are kept good.

As can be clearly seen from the above-described embodiment, a resin-clad metal foil (30) of a first aspect according to the present invention is a resin-clad metal foil (30) including a metal foil (50), a first insulating layer (21), and a second insulating layer (22). The first insulating layer (21) and the second insulating layer (22) are disposed in this order on the metal foil (50).

The first insulating layer (21) includes a polyimide resin layer (9), a polyamideimide resin layer (8), a liquid crystal polymer resin layer (4), a fluororesin layer (5), or a polyphenylene ether resin layer (6).

The second insulating layer (22) includes a polyolefin resin layer (3) in a semi-cured state.

The polyolefin resin layer (3) contains a component (A) representing a polyolefin-based elastomer and a component (B) representing a thermosetting resin.

The percentage by weight of the component (A) representing the polyolefin-based elastomer in the polyolefin resin layer (3) ranges from 50 wt. % to 95 wt. %.

The first aspect enables the degree of fluidity of a resin during molding to be reduced and enables extrusion of the resin to be reduced while maintaining good adhesiveness, bendability, thermal resistance, and circuit filling property.

In a resin-clad metal foil (30) of a second aspect according to the present invention, the component (A) representing the polyolefin-based elastomer contains one kind or two or more kinds of components selected from a group consisting of polystyrene-poly (ethylene/propylene) block-polystyrene copolymer, polystyrene-poly (ethylene-ethylene/propylene) block-polystyrene copolymer, polystyrene-poly (ethylene/butylene) block-polystyrene copolymer, polystyrene-polyisoprene block copolymer, hydrogenated polystyrene-polyisoprene-polybutadiene block copolymer, polystyrene-poly (butadiene/butylene) block-polystyrene copolymer, ethylene-glycidyl methacrylate copolymer, ethylene-glycidyl methacrylate-methyl acrylate copolymer, and ethylene-glycidyl methacrylate-vinyl acetate copolymer.

In a resin-clad metal foil (30) of a third aspect according to the present invention, the component (B) representing the thermosetting resin contains one kind or two or more kinds of components selected from a group consisting of an epoxy resin, a phenol resin, a bismaleimide resin, and a polyphenylene ether oligomer having vinyl groups at both ends.

In a resin-clad metal foil (30) of a fourth aspect according to the present invention, the polyolefin resin layer (3) further contains a component (C) representing a curing accelerator.

In a resin-clad metal foil (30) of a fifth aspect according to the present invention, the polyolefin resin layer (3) further contains a component (D) representing filler.

In a resin-clad metal foil (30) of a sixth aspect according to the present invention, the polyolefin resin layer (3) subjected to a treatment at 180° C. for 60 minutes has a storage elastic modulus within a range of $10^5$ Pa to $10^8$ Pa at a temperature ranging from 25° C. to 150° C.

The sixth aspect enables the thermal shock resistance of the flexible printed wiring board (40) to be increased and further enables the solder thermal resistance during reflow to be increased.

A flexible printed wiring board (40) according to one aspect of the present invention includes the insulating layer (2) constituted by fully cured materials of the first insulating layer (21) and the second insulating layer (22) of the resin-clad metal foil (30).

The flexible printed wiring board (40) of the one aspect enables the degree of fluidity of a resin during molding to be reduced and enables extrusion of the resin to be reduced while maintaining good adhesiveness, bendability, thermal resistance, and circuit filling property.

EXAMPLES

The present invention will be described below specifically with reference to examples below, but the present invention is not limited to the examples.

Example 1

Example 1 includes eleven examples, that is, Examples 1-(1) to 1-(11). These examples are the same except for only a second insulating layer.

"R-F552" manufactured by Panasonic Corporation was prepared ("R-F552" is a two-layer casting flexible copper clad laminated board fabricated by applying a liquid polyimide resin composition to a surface of a copper foil and heating and drying the liquid polyimide resin composition, wherein the copper foil has a thickness of 12 μm, and a polyimide resin layer in a cured state has a thickness of 12.5 μm).

A polyolefin resin composition having a resin composition of each of (1) to (11) shown in Table 3 was applied to a surface of the polyimide resin layer, heated and dried to form a polyolefin resin layer which is in a semi-cured state and which has a thickness of 50 μm. Thus, a resin-clad metal foil including a first insulating layer (the polyimide resin layer in a cured state) and a second insulating layer (polyolefin resin layer in a semi-cured state) disposed in this order on a metal foil (copper foil) was obtained. Table 4 shows specific manufacturers, product names, and the like of components (A) to (D) contained in the polyolefin resin compositions of (1) to (11) shown in Table 3.

Example 2

A second example includes eleven examples, that is, Examples 2-(1) to 2-(11). These examples are the same except for only the second insulating layer.

A liquid polyamideimide resin composition was applied on a surface of a copper foil having a thickness of 12 μm and was heated and dried to form a polyamideimide resin layer which is in a cured state and which has a thickness of 12.5 μm.

The liquid polyamideimide resin composition was prepared as described below. A mixture was obtained by blending 192 g of trimellitic acid anhydride (manufactured by Nacalai Tesque, Inc.), 211 g of 4,4'-diisocyanate-3,3'-dimethyl biphenyl, 35 g of 2,4-diisocyanatotoluene, 1 g of diazabicycloundecene (San-Apro Ltd.), and 2482 g of N,N-dimethyl acetamide (DMAC, manufactured by Nacalai Tesque, Inc.) so as to realize a polymer concentration of 15 wt. %, and the thus obtained mixture was heated to 100° C. in 1 hour and was subsequently maintained at 100° C. for six hours to promote reaction. Then, 1460 g of DMAC were further added to the mixture to adjust the polymer concentration to 10 wt. %, and the mixture was subsequently cooled to a room temperature. Thus, the liquid polyamideimide resin composition was obtained as a resin solution containing polyamideimide dissolved therein.

Then, a polyolefin resin composition having a resin composition of each of (1) to (11) shown in Table 3 was applied to a surface of the polyamideimide resin layer and was heated and dried to form a polyolefin resin layer which is in a semi-cured state and which has a thickness of 50 µm. Thus, a resin-clad metal foil including a first insulating layer (polyamideimide resin layer in a cured state) and a second insulating layer (polyolefin resin layer in a semi-cured state) disposed in this order on a metal foil (copper foil) was obtained. Table 4 shows specific manufacturers, product names, and the like of components (A) to (D) contained in the polyolefin resin compositions of (1) to (11) shown in Table 3.

Comparative Example 1

An epoxy resin layer is used instead of the polyolefin resin layer in Example 1. Contents except for the epoxy resin layer are the same as those in Example 1.

The resin composition of an epoxy resin composition to be included in the epoxy resin layer is shown in (12) in Table 3. Specific manufacturers and product names of the components (E) to (I) included in the epoxy resin composition are shown in Table 4. Carbodiimide modified polyamide of the resin compositions was synthesized from a synthesized carbodiimide compound as described below.

(Synthesis of Carbodiimide Compound)

A reaction of 590 g of 4,4'-dicyclohexyl methane diisocyanate, 62.6 g of cyclohexyl isocyanate, and 6.12 g of carbodiimidization catalyst (3-methyl-1-phenyl-2-phospholene-1-oxide) at 180° C. for 48 hours was caused to obtain a 4,4'-dicyclohexyl methane carbodiimide resin (polymerization degree=10) as a carbodiimide compound.

(Synthesis of Carbodiimide Modified Polyamide)

Into a one-liter separable flask, 50.0 g of an ester copolymer amide resin (product name: "CM8000", manufactured by Toray Industries, Inc.) and 450.0 g of a mixed solvent of isopropyl alcohol and toluene (mixing ratio by weight 4:6) were added and dissolved by agitation. To the thus obtained solution, 5.0 g of the carbodiimide compound (4,4'-dicyclohexyl methane carbodiimide resin) was added, and the flask was immersed in an oil-bath at 120° C. and heated and agitated under reflux for 3 hours. Then, the solvent was removed by drying under reduced pressure, thereby obtaining carbodiimide modified polyamide.

The thus obtained carbodiimide modified polyamide was subjected to infrared spectrophotometric measurement, and a respiratory peak representing the presence of a carbodiimide group was observed at 2120 $cm^{-1}$. Moreover, the carbodiimide-modified polyamide was subjected to differential scanning heat quantity measurement, and one heat absorbing peak was observed. Note that the glass transition temperature (Tg) of the carbodiimide-modified polyamide was 120° C., a temperature at which 5% weight loss occurs was 320° C., and the viscosity of the solution was 860 mPa·s.

Comparative Example 2

An epoxy resin layer was used instead of the polyolefin resin layer in Example 1. Other contents are the same as those in Example 1 except for the epoxy resin.

A resin composition of an epoxy resin composition for forming the epoxy resin layer is shown in (13) in Table 3. Specific manufacturers and product names of components (E) to (I) included in the epoxy resin composition are shown in Table 4. The carbodiimide-modified polyamide of the resin composition was synthesized in a manner similar to Comparative Example 1.

(Copper Foil Peeling Strength)

Resin-clad metal foils were individually bonded to both surfaces of a polyimide film having a thickness of 25 µm with second insulating layers of the resin-clad metal foils being individually on the both surfaces of the polyimide film, and the resin-clad metal foils and the polyimide film were hot pressed at 180° C. for 1 hour. Samples are thus formed. The copper foil peeling strength when a metal foil (copper foil) of each sample was peeled in a direction forming an angle of 90° with respect to a surface of the sample was measured. The results of the measurement are shown in Tables 1 and 2.

(Bendability)

Prepared was a flexible printed wiring board provided with a circuit having an MIT pattern formed from electrolytic copper foil having a thickness of 18 µm on one surface of a polyimide film having a thickness of 25 µm. Resin-clad metal foils were individually bonded to both surfaces of the flexible printed wiring board with second insulating layers of the resin-clad metal foils being individually on the both surfaces of the polyimide film, and the resin-clad metal foils and the flexible printed wiring board were hot pressed at 180° C. for 1 hour. Thereafter, a metal foil of the resin-clad metal foil on each surface was removed by overall etching. Samples were thus formed. Each sample was subjected to an MIT test. Measurement conditions were set such that R of bending clamp=0.38 mm, load is 500 gf, and the number of bending times per minute is 175. The bendability was evaluated based on the number of bending times before the conduction of the circuit was no longer established. Specifically, the number of bending times higher than or equal to 100 was determined as a "pass", and the number of bending times less than 100 was determined as a "fail". The results of the evaluation are shown in Tables 1 and 2.

(Solder Thermal Resistance)

Resin-clad metal foils were individually bonded to both surfaces of a polyimide film having a thickness of 25 µm with second insulating layers of the resin-clad metal foil being individually on the both surfaces of the polyimide film, and the resin-clad metal foils and the polyimide film were hot pressed at 180° C. for 1 hour. Samples were thus formed. Each sample was immersed for 60 seconds in a solder bath at 260° C. and a solder bath at 288° C. Then, the exterior of each sample was observed to evaluate the solder thermal resistance. Samples in which none of swelling, peeling, and the like were observed were determined as a "pass", and the other samples were determined as a "fail". The results of the evaluation are shown in Tables 1 and 2.

(Circuit Filling Property)

Prepared was a flexible printed wiring board provided with a circuit having a comb pattern made of a rolled copper foil having a thickness of 35 µm. A resin-clad metal foil was bonded to the flexible printed wiring board with a second insulating layer of the resin-clad metal foil being on a circuit formation surface of the flexible printed wiring board, and the resin-clad metal foil and the flexible printed wiring board were hot pressed at 180° C. for 1 hour. Samples were thus formed. Cut surfaces of the samples were visually observed to evaluate circuit filling properties of the samples. Samples with a resin filling the entire space between circuits were determined as a "pass", and the other samples were determined as a "fail". The results of the evaluation are shown in Tables 1 and 2.

(Resin Fluidity)

A hole having a diameter of 10 mm was formed in a resin-clad metal foil. Then, the resin-clad metal foil was bonded to a gloss surface of an electrolytic copper foil with a second insulating layer of the resin-clad metal foil being on the gloss surface. The resin-clad metal foil and the electrolytic copper foil were hot pressed at 170° C. for 30 minutes, thereby forming samples. At this time, the length by which the resin flows into the pore was measured to evaluate the resin fluidity. If a sample has the length of flow less than or equal to 1.0 mm, it is determined as a "pass", and if a sample has the length of flow more than 1.0 mm, it is determined as a "fail". The results of the evaluation are shown in Tables 1 and 2.

TABLE 1

|  |  | Examples 1-(1) to 1-(11) | Examples 2-(1) to 2-(11) |
|---|---|---|---|
| Configuration of Resin-Clad Metal Foil | Metal Foil | Copper Foil (Thickness: 12 μm) | Copper Foil (Thickness: 12 μm) |
|  | First Insulating Layer | Polyimide Resin Layer (Thickness: 12.5 μm) | Polyamideimide Resin Layer (Thickness: 12.5 μm) |
|  | Second Insulating Layer | Polyolefin Resin Layer (Thickness: 50 μm) Polyolefin Resin Compositions in (1) to (11) Shown in Table 3 | Polyolefin Resin Layer (Thickness: 50 μm) Polyolefin Resin Compositions in (1) to (11) Shown in Table 3 |
| Copper Foil Peeling Strength |  | 0.7 N/mm | 0.7 N/mm |
| Bendability (MIT, 500 gf, 175 times/min, R = 0.38 mm, 100 or more times) |  | Pass | Pass |
| Thermal Resistance (260° C., 60 seconds, Solder Float) |  | Pass | Pass |
| Thermal Resistance (288° C., 60 seconds, Solder Float) |  | Pass | Pass |
| Circuit Filling Property (35 μm) |  | Pass | Pass |
| Resin Fluidity (1.0 mm or less) |  | Pass | Pass |

TABLE 2

|  |  | Comparative Example 1 | Comparative Example 2 |
|---|---|---|---|
| Configuration of Resin-Clad Metal Foil | Metal Foil | Copper Foil (Thickness: 12 μm) | Copper Foil (Thickness: 12 μm) |
|  | First Insulating Layer | Polyimide Resin Layer (Thickness: 12.5 μm) | Polyimide Resin Layer (Thickness: 12.5 μm) |
|  | Second Insulating Layer | Epoxy Resin Layer (Thickness: 50 μm) Epoxy Resin Composition in (12) Shown in Table 3 | Epoxy Resin Layer (Thickness: 50 μm) Epoxy Resin Composition in (13) Shown in Table 3 |
| Copper Foil Peeling Strength |  | 0.7 N/mm | 0.7 N/mm |
| Bendability (MIT, 500 gf, 175 times/min, R = 0.38 mm, 100 or more times) |  | Pass | Pass |
| Thermal Resistance (260° C., 60 seconds, Solder Float) |  | Pass | Pass |
| Thermal Resistance (288° C., 60 seconds, Solder Float) |  | Pass | Pass |
| Circuit Filling Property (35 μm) |  | Pass | Pass |
| Resin Fluidity (1.0 mm or less) |  | Fail | Fail |

TABLE 3

Resin Composition Ratio of Resin Composition Included in Second Insulating Layer in Examples 1 and 2 and Comparative Examples 1 and 2 (unit: parts by mass)

| | | | (1) | (2) | (3) | (4) | (5) | (6) | (7) | (8) | (9) | (10) | (11) | (12) | (13) |
|---|---|---|---|---|---|---|---|---|---|---|---|---|---|---|---|
| Component (A) | 1 | SEPS | 100 | — | — | — | — | — | — | 50 | 100 | 50 | 150 | — | — |
| | 2 | SEEPS | — | 100 | — | — | — | — | — | 50 | — | — | — | — | — |
| | 3 | SEBS | — | — | 100 | — | — | — | — | — | — | — | — | — | — |
| | 4 | SIS | — | — | — | 100 | — | — | — | — | — | — | — | — | — |
| | 5 | Hydrogenated SIBS | — | — | — | — | 100 | — | — | — | — | — | — | — | — |
| | 6 | SBBS | — | — | — | — | — | 100 | — | — | — | — | — | — | — |
| | 7 | E-GMA-MA | — | — | — | — | — | — | 100 | — | — | — | — | — | — |
| Component (B) | 1 | Epoxy | 30 | 20 | — | — | — | — | — | — | — | — | — | — | — |
| | 2 | Phenol 1 | — | 10 | — | — | — | — | — | — | — | — | — | — | — |
| | 3 | Phenol 2 | — | — | 20 | — | 5 | — | — | — | — | — | — | — | — |
| | 4 | Phenol 3 | — | — | — | 5 | — | — | — | — | — | — | — | — | — |
| | 5 | BMI 1 | — | — | — | 25 | 10 | — | — | — | — | — | — | — | — |
| | 6 | BMI 2 | — | — | — | — | — | 10 | 10 | 10 | 10 | 10 | 10 | — | — |
| | 7 | OPE-Vn | — | — | — | — | 15 | 20 | 20 | 20 | 20 | 20 | 20 | — | — |
| Component (C) | 1 | Curing Accelerator | 0.3 | 0.1 | — | — | — | — | — | — | — | — | — | — | — |
| Component (D) | 1 | Silica | — | — | — | — | — | — | — | — | 10 | — | — | — | — |
| Component (E) | 1 | Epoxy Resin (1) with Naphthalene Framework | — | — | — | — | — | — | — | — | — | — | — | 27.3 | — |
| | 2 | Epoxy Resin (2) with Naphthalene Framework | — | — | — | — | — | — | — | — | — | — | — | — | 29.7 |
| Component (F) | 1 | Phenol Novolak-Type Aminotriazine Novolak Resin | — | — | — | — | — | — | — | — | — | — | — | 17.2 | 13.1 |
| Component (G) | 1 | Carbodiimide Modified Polyamide | — | — | — | — | — | — | — | — | — | — | — | 36.4 | 38.1 |
| Component (H) | 1 | Curing Accelerator | — | — | — | — | — | — | — | — | — | — | — | 0.1 | 0.1 |
| Component (I) | 1 | Phosphazene | — | — | — | — | — | — | — | — | — | — | — | 19 | 19 |

TABLE 4

Manufacturers, Product Names, etc. of Components Included in Resin Compositions Used in Examples 1 and 2 and Comparative Examples 1 and 2

| | | | Manufacturer | Product Name |
|---|---|---|---|---|
| Component (A) | 1 | SEPS | Kuraray Co., Ltd. | SEPTON 2007 |
| | 2 | SEEPS | Kuraray Co., Ltd. | SEPTON 4055 |
| | 3 | SEBS | Asahi Kasei Corp. | Tuftec H1221 |
| | 4 | SIS | Zeon Corporation | Quintac 3450 |
| | 5 | Hydrogenated SIBS | Kuraray Co., Ltd. | HYBRAR 7311 |
| | 6 | SBBS | Asahi Kasei Corp. | Tuftec P1500 |
| | 7 | E-GMA-MA | Sumitomo Chemical Co., Ltd. | BONDFAST 7M |
| Component (B) | 1 | Epoxy | DIC Corporation | EPICLON HP7200 |
| | 2 | Phenol 1 | Showa Denko K.K. | Shonol CKM2400 |
| | 3 | Phenol 2 | Showa Denko K.K. | Shonol CKM908 |
| | 4 | Phenol 3 | Gunei Chemical Industry Co., Ltd. | RESITOP PS-2655 |
| | 5 | BMI 1 | K.I Chemical Industry Co., Ltd. | BMI-70 |
| | 6 | BMI 2 | K.I Chemical Industry Co., Ltd. | BMI-80 |
| | 7 | OPE-Vn | MITSUBISHI GAS CHEMICAL COMPANY, INC. | OPE-2st-2200 |
| Component (C) | 1 | Curing Accelerator | Reagent | 2-ethyl-4-methylimidazole |
| Component (D) | 1 | Silica | NIPPON AEROSIL CO., LTD. | AEROSIL 200 |
| Component (E) | 1 | Epoxy Resin (1) with Naphthalene Framework | Nippon Kayaku Co., Ltd. | NC-7000L |
| | 2 | Epoxy Resin (2) with Naphthalene Framework | DIC Corporation | EXA-9900 |
| Component (F) | 1 | Phenol Novolak-Type | DIC Corporation | LA-7052 |

TABLE 4-continued

Manufacturers, Product Names, etc. of Components
Included in Resin Compositions Used in Examples 1
and 2 and Comparative Examples 1 and 2

| | | | Manufacturer | Product Name |
|---|---|---|---|---|
| Component (G) | 1 | Aminotriazine Novolak Resin Carbodiimide Modified Polyamide | — | — |
| Component (H) | 1 | Curing Accelerator | SHIKOKU CHEMICALS CORPORATION | 2E4MZ |
| Component (I) | 1 | Phosphazene | Otsuka Chemical Co., Ltd. | SPB-100 |

In each of Examples 1 and 2, the evaluations of the items lead to the same results for all the second insulating layers made of eleven polyolefin resin compositions.

As can be seen from Tables 1 and 2, each example has a good adhesive property (copper foil peeling strength), bendability, and thermal resistance (solder thermal resistance), and the resin in each example is less likely to flow, but each example has a good circuit filling property.

In contrast, each comparative example has a good adhesive property, bendability, thermal resistance, and circuit filling property, but the resin in each comparative example is likely to flow.

REFERENCE SIGNS LIST

4 Liquid Crystal Polymer Resin Layer
5 Fluororesin Layer
6 Polyphenylene Ether Resin Layer
8 Polyamideimide Resin Layer
9 Polyimide Resin Layer
21 First Insulating Layer
22 Second Insulating Layer
30 Resin-Clad Metal Foil
40 Flexible Printed Wiring Board
50 Metal Foil

The invention claimed is:

1. A resin-clad metal foil, comprising
a metal foil;
a first insulating layer; and
a second insulating layer,
the first insulating layer and the second insulating layer being disposed in this order on the metal foil,
the first insulating layer including a polyimide resin layer, a polyamideimide resin layer, a liquid crystal polymer resin layer, a fluororesin layer, or a polyphenylene ether resin layer,
the second insulating layer including a polyolefin resin layer in a semi-cured state,
the polyolefin resin layer containing
a component (A) representing a polyolefin-based elastomer and
a component (B) representing a thermosetting resin,
a percentage by weight of the component (A) representing the polyolefin-based elastomer in the polyolefin resin layer ranges from 50 wt. % to 95 wt. %; and
the component (A) representing the polyolefin-based elastomer contains one or more kinds of components selected from a group consisting of polystyrene-poly (ethylene/propylene) block-polystyrene copolymer, polystyrene-poly (ethylene-ethylene/propylene) block-polystyrene copolymer, polystyrene-poly (ethylene/butylene) block-polystyrene copolymer, polystyrene-polyisoprene block copolymer, hydrogenated polystyrene-polyisoprene-polybutadiene block copolymer, polystyrene-poly (butadiene/butylene) block-polystyrene copolymer, ethylene-glycidyl methacrylate copolymer, ethylene-glycidyl methacrylate-methyl acrylate copolymer, and ethylene-glycidyl methacrylate-vinyl acetate copolymer.

2. The resin-clad metal foil according to claim 1, wherein the component (B) representing the thermosetting resin contains one kind or two or more kinds of components selected from a group consisting of an epoxy resin, a phenol resin, a bismaleimide resin, and a polyphenylene ether oligomer having vinyl groups at both ends.

3. The resin-clad metal foil according to claim 1, wherein the polyolefin resin layer further contains a component (C) representing a curing accelerator.

4. The resin-clad metal foil according claim 1, wherein the polyolefin resin layer further contains a component (D) representing filler.

5. The resin-clad metal foil according to claim 1, wherein the polyolefin resin layer subjected to a treatment at 180° C. for 60 minutes has a storage elastic modulus within a range of $10^5$ Pa to $10^8$ Pa at a temperature ranging from 25° C. to 150° C.

6. A flexible printed wiring board comprising an insulating layer which is constituted by fully cured materials of the first insulating layer and the second insulating layer of the resin-clad metal foil according to claim 1.

* * * * *